(12) United States Patent
Nakajima

(10) Patent No.: US 7,997,567 B2
(45) Date of Patent: Aug. 16, 2011

(54) STAGE APPARATUS

(75) Inventor: Ryuta Nakajima, Yokohama (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 690 days.

(21) Appl. No.: 11/984,170

(22) Filed: Nov. 14, 2007

(65) Prior Publication Data
US 2008/0087791 A1    Apr. 17, 2008

Related U.S. Application Data

(63) Continuation of application No. PCT/JP2006/314356, filed on Jul. 20, 2006.

(30) Foreign Application Priority Data

Jul. 21, 2005  (JP) ................. 2005-211724

(51) Int. Cl.
*B23Q 1/64* (2006.01)
(52) U.S. Cl. ........................... 269/57; 269/59
(58) Field of Classification Search ............ 269/55, 269/289 R, 60
See application file for complete search history.

(56) References Cited

U.S. PATENT DOCUMENTS 5,609,332 A * 3/1997 Hassell ............ 269/16
5,717,482 A * 2/1998 Akutsu et al. ........ 355/53

FOREIGN PATENT DOCUMENTS

| JP | 07-230950 | 8/1995 |
| JP | 7226354 A | 8/1995 |
| JP | 2003-028973 | 1/2003 |
| JP | 2003-028974 | 1/2003 |
| KR | 0180925 | 4/1999 |

* cited by examiner

*Primary Examiner* — Lee D Wilson
*Assistant Examiner* — Jamal Daniel
(74) *Attorney, Agent, or Firm* — Squire, Sanders & Dempsey (US) LLP

(57) ABSTRACT

A stage apparatus, includes a holding member configured to hold a subject; an elevation supporting member configured to support the holding member so that the holding member can go up and down; a rotation supporting member configured to support the elevation supporting member so that the elevation supporting member can be rotated with respect to a Z axis; and a Z axis driving part configured to elevate the holding member in a Z axial direction; wherein the Z axis driving part is located on the rotation supporting member and makes the holding member go up and down relative to the rotation supporting member.

12 Claims, 4 Drawing Sheets

STAGE APPARATUS

CROSS-REFERENCE TO RELATED APPLICATION

This application is a U.S. continuation application filed under 35 USC 111(a) claiming benefit under 35 USC 120 and 365(c) of PCT application JP06/314356, filed Jul. 20, 2006, which claims priority to Application Ser. No. 2005-211724, filed in Japan on Jul. 21, 2005. The foregoing applications are hereby incorporated herein by reference.

BACKGROUND OF THE INVENTION

1. Field of the Invention

The present invention generally relates to stage apparatuses. More particularly, the present invention relates to a stage apparatus whereby micro moving control is stably implemented at the time when a holding member configured to hold a subject goes up and down in a Z axial direction.

2. Description of the Related Art

In a stage apparatus, a subject wafer is positioned with high precision in response to carrying the wafer and holding the wafer by a wafer holding member having a vacuum chuck or an ESC (Electrostatic Chuck). Therefore, the wafer holding member is operated in a Z axial direction and a θ z direction around the Z axial direction so that positioning control for adjusting position of the wafer is implemented.

In the stage apparatus, a pair of Z axis actuators is arranged with 180 degree gaps therebetween in the circumferential direction. The pair of Z axis actuators implements fine adjustment of a height position of the wafer to correspond to focal length (focal depth) of a CCD (Charge Coupled Device) camera for imaging the wafer. In addition, the wafer holding member is supported by a rotation supporting member mounted on a XY stage. An elevation supporting member is located on the rotation supporting member rotatably supported by a bearing in the θ z direction. A pair of the Z axis actuators is located in a circumferential edge part of the elevation supporting member. A z axial guide part is located in the center of the elevation supporting member and guides the wafer holding member so as to go up or down with the wafer holding member.

In the above-mentioned stage apparatus, a pair of the Z axis actuators is located at the elevation supporting member rotatably supported by the bearing. Therefore, the reaction force from the Z axis actuator is applied to the elevation supporting member by driving forces of a pair of the X axis actuators.

Since the elevation supporting member is rotatably supported by the bearing, if values of two reaction forces from a pair of the Z axis actuators are different from each other, or timings of application of two reaction forces are not consistent with each other, the elevation supporting member may be oscillated in a state where the bearing is a fulcrum of the oscillation.

Such movement of the elevation supporting member due to the reaction forces from the X axis actuators may cause an error when the relative position between the wafer and an optical system is adjusted in a fine manner.

On the other hand, when a coarse moving operation of the wafer holding member in the Z axial direction is done, the driving force is large and therefore a reaction force is also large. Because of this, a mechanical natural vibration (characteristic vibration) of the elevation supporting member and XY stage where the elevation supporting member is mounted may be induced.

In this case, settling time until the vibration of the elevation supporting member due to the reaction force of the coarse moving control is dissipated may be long so that the micro moving control in the Z axial direction is delayed.

SUMMARY OF THE INVENTION

Accordingly, embodiments of the present invention can provide a novel and useful stage apparatus, in which one or more of the problems described above are eliminated.

More specifically, the embodiments of the present invention can provide a stage apparatus whereby vibration due to a reaction force from a Z axis actuator at the time when a holding member configured to hold a subject goes up and down in a Z axial direction is prevented so that micro moving control in the Z axial direction can be stably implemented.

The embodiments of the present invention can also provide a stage apparatus, including a holding member configured to hold a subject; an elevation supporting member configured to support the holding member so that the holding member can go up and down; a rotation supporting member configured to support the elevation supporting member so that the elevation supporting member can be rotated with respect to a Z axis; and a Z axis driving part configured to elevate the holding member in a Z axial direction; wherein the Z axis driving part is located on the rotation supporting member and makes the holding member go up and down relative to the rotation supporting member.

Other objects, features, and advantages of the present invention will become more apparent from the following detailed description when read in conjunction with the accompanying drawings.

DETAILED DESCRIPTION OF THE PREFERRED EMBODIMENT

A description will now be given, with reference to FIG. 1 through FIG. 4, of embodiments of the present invention.

FIRST EXAMPLE

Figure 1:
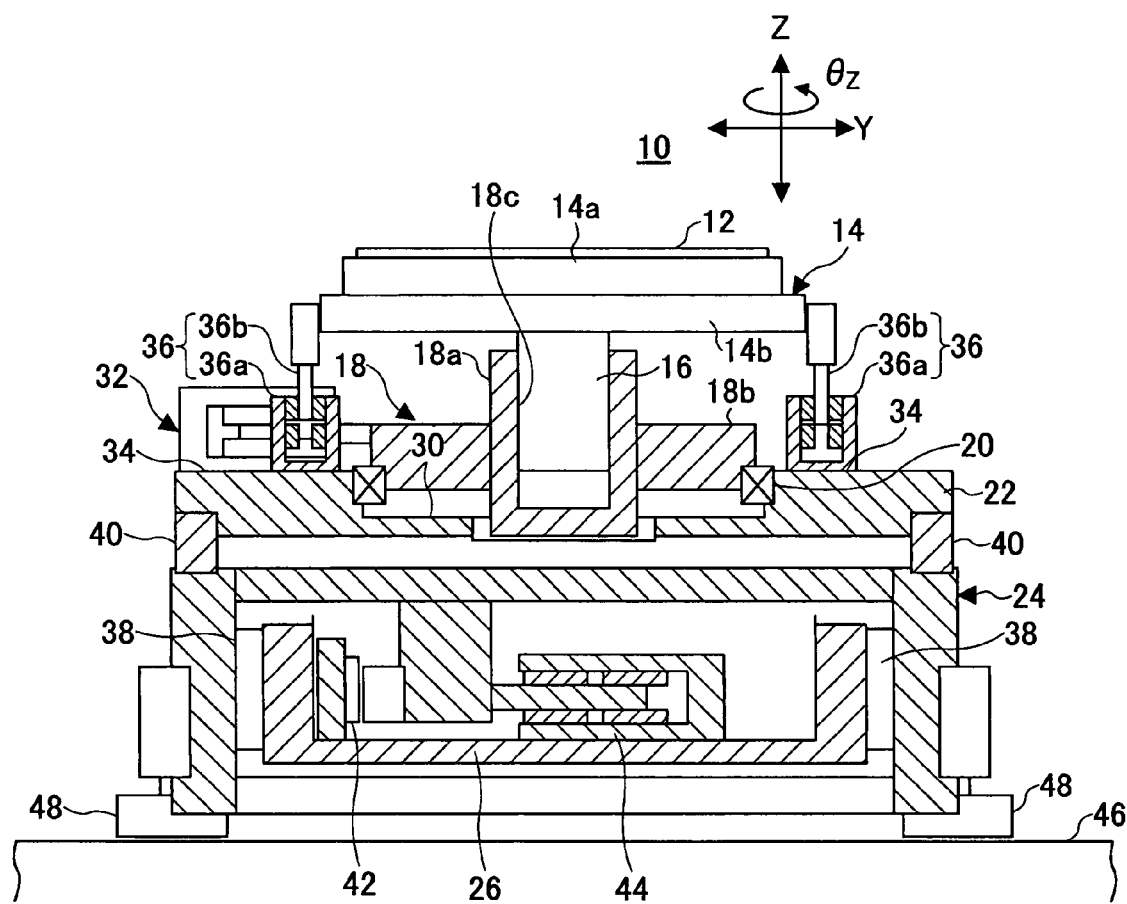
FIG. 1 is a longitudinal cross-sectional view showing an example of a stage apparatus of the present invention.
Figure 2:
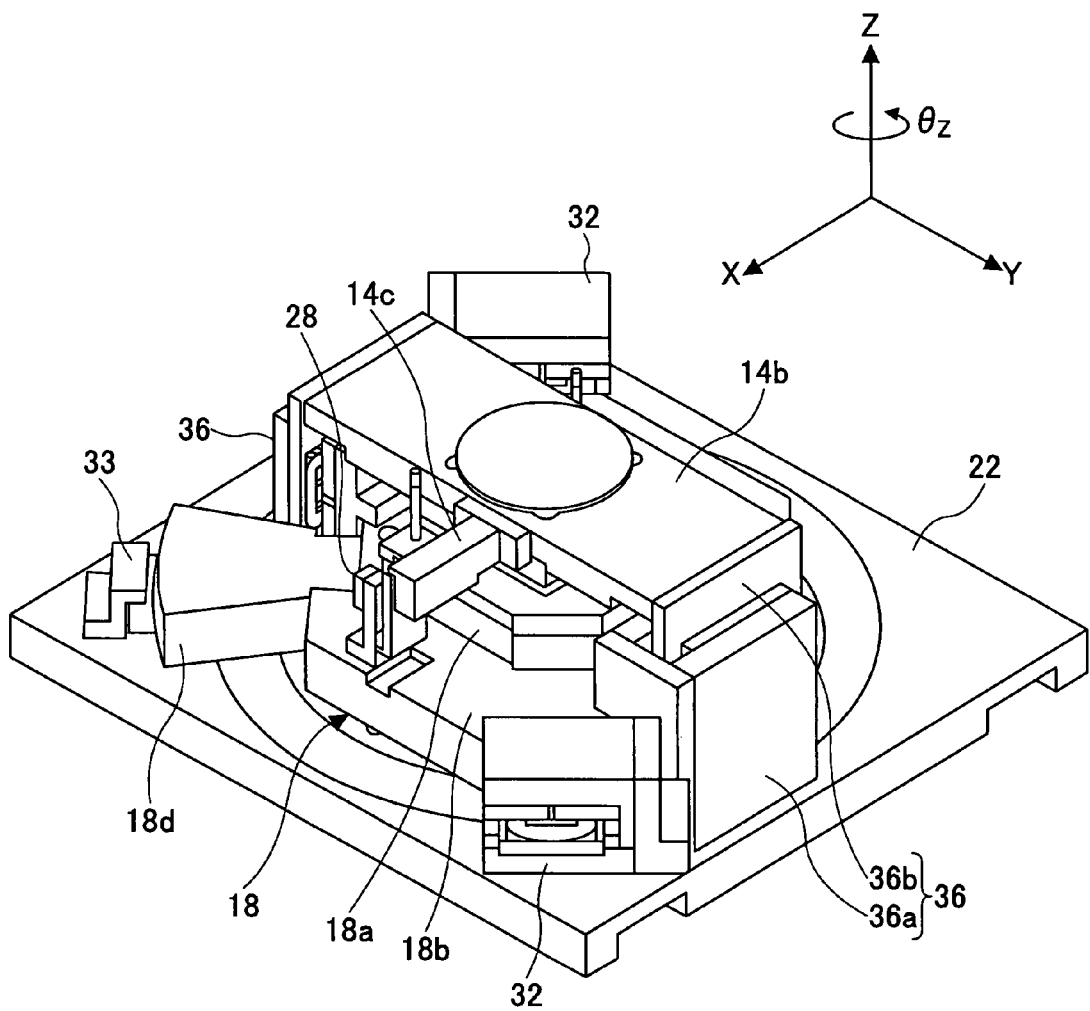
FIG. 2 is a perspective view showing the stage apparatus shown in FIG. 1.

FIG. 1 is a longitudinal cross-sectional view showing an example of a stage apparatus of the present invention. FIG. 2 is a perspective view showing the stage apparatus shown in FIG. 1. In FIG. 2, for the convenience of explanation, illustration of a wafer holding member 14 where a wafer 12 is mounted is omitted.

As shown in FIG. 1 and FIG. 2, a stage apparatus 10 includes the wafer holding member 14 as a holding member, a Z axis supporting base 18 as an elevation supporting member, a θ z supporting base 22 as a rotation supporting member, an XY table 24, and a Y stage 26.

The wafer 12 is mounted on the wafer holding member 14. The Z axis supporting base 18 supports a Z axis member 16 of the wafer holding member 14 so that the Z axis member 16 can go up and down. The θ z supporting base 22 rotatably supports the Z axis supporting base 18 via a bearing 20. The θ z supporting base 22 is mounted on the XY table 24 via poles 40. The XY table 24 is attached to the Y stage 26.

In addition, the XY table 24 is provided so as to move in an extending direction (X axial direction) of the Y stage 26 and has an inside where the Y stage 26 is inserted. An X direction linear scale 42 and an X direction linear actuator 44 are mounted on the Y stage 26.

Furthermore, static pressure pads 38 applying a holding force in a Y direction against the XY table 24 are provided on external walls of left and right side surfaces of the Y stage 26. Static pressure pads 48 applying a floating force in a Z direction for holding the XY table 24 above a stone surface plate 46 are provided on lower ends of leg parts at left and right sides of the XY table 24.

The wafer holding member 14 includes an absorption part 14*a* and a horizontal member 14*b*. The absorption part 14*a* includes a vacuum chuck or electrostatic chuck (not shown) provided on an upper surface of the absorption part 14*a* and configured to hold the wafer 12. The absorption part 14*a* is mounted on the horizontal member 14*b*.

In addition, the Z axis member 16 is provided projecting downward in the center of a lower surface of the horizontal member 14*b*. The Z axis member 16 has a non-circular, such as a square, shaped horizontal cross section so that the Z axis member 16 is prevented from being rotated in a θ z direction.

The Z axis supporting base 18 includes a Z axis guide part 18*a* and a disk shaped brim part 18*b*. The Z axis member 16 is slidably engaged with the Z axis guide part 18*a*. The brim part 18*b* extends in a horizontal direction from a side surface of the Z axis guide part 18*a*. A guide hole forming part 18*c* is formed inside the Z axis guide part 18*a*. The Z axis member 16 is engaged with the guide hole forming part 18*c*.

The guide hole forming part 18*c* has a horizontal cross section the same as that of the Z axis member 16, such as a square shaped cross section. Because of this, the rotation in the θ z direction of the wafer holding member 14 is limited by engaging the Z axis member 16 with the guide hole forming part 18*c*.

A Z axial direction encoder 28 configured to detect the elevation position of the wafer holding member 14 is provided at the Z axis supporting base 18. The Z axial direction encoder 28 optically or magnetically detects the elevation position of a detected part 14*c* of the wafer holding member 14. The detected part 14*c* projects from the wafer holding member 14.

In addition, the Z axis supporting base 18 is rotatably supported in the θ z direction by the bearing 20 and driven in the θ z direction by a θz driving actuator 32. The bearing 20 is a cross roller bearing having high rigidity and high rotational precision and is held in a circular shaped concave part 30 formed in the center of the θ z supporting base 22.

The θ z driving actuator 32 is made of a voice coil formed by combining a coil and a magnet. The θ z driving actuator 32 is a driving part configured to make fine adjustments of the position of the wafer 12 mounted on the wafer holding member 14 in the θ z direction so that the wafer 12 is situated in a designated position.

Since the driving force of the θ z driving actuator 32 is applied to the Z axis supporting base 18, the wafer holding member 14 is rotated in a body with the Z axis supporting base 18 so that fine adjustment of the position in the θ z direction is made.

In addition, a θ z direction encoder 33 is provided on the θ z supporting base 22 configured to detect the rotational angle in the θ z direction when the Z axis supporting base 18 is rotated by the θ z supporting base 32. The θ z direction encoder 33 counts the pulse numbers proportional to the rotational position of the detected part 18*d* projecting from the Z axis supporting base 18 in the horizontal direction so that the rotational angle in the θ z direction is output.

A pair of Z axis actuators 36 is provided on a plane surface part 34 of the θ z supporting base 22 formed outside the circular shaped concave part 30. The Z axis actuator 36, as well as the θ z driving actuator 32, is formed by the voice coil motor. The Z axis actuator 36 includes a stator 36*a* provided on the plane surface part 34 and a rotor 36*b* driven against the stator 36*a*. The stator 36*a* has a magnet and the rotor 36*b* has a coil.

Furthermore, in the above-discussed example, the stators 36*a* of the Z axis actuators 36 are fixed on the plane surface parts 34 of the θ z supporting base 22 and the rotors 36*b* are fixed to corresponding ends of the horizontal member 14*b* of the wafer holding member 14.

In addition, the Z axis actuators 36 are arranged in the circumferential direction of the θ z direction with 180 degrees gap therebetween so that both ends of the horizontal member 14*b* can go up and down.

Accordingly, the pair of the Z axis actuators 36 is controlled so that the driving forces are simultaneously applied to the horizontal member 14*b* of the wafer holding member 14 and the horizontal member 14*b* can go up and down without leaning against the upper surface of the Z axis supporting base 18. At that time, a reaction force of the driving force of the Z axis actuator 36 is received by the θ z supporting base 22.

Since the θ z supporting base 22 is fixed to the XY table 24, the θ z supporting base 22 can be regarded as being unified with the XY table 24. For example, at the time when the wafer holding member 14 goes up, even if a reaction force is applied to the surface part 34 of the θz supporting base 22 so that the surface part 34 is pushed down, the reaction force is supported by the entirety of the XY table 24 and the θ z supporting base 22.

Therefore, it is possible to prevent vibration caused by the reaction force of the driving force of the Z axis actuator 36 in the stage apparatus 10. Hence, for example, even if the fine control of the Z axis actuator 36 is done after the coarse control of the Z axis actuator 36 is done so that the wafer holding member 14 goes up and down, it is not necessary to wait for the vibration generated by the coarse control to settle out. Therefore, it is possible to start the fine control in the Z axial direction earlier than the conventional art.

Figure 3:
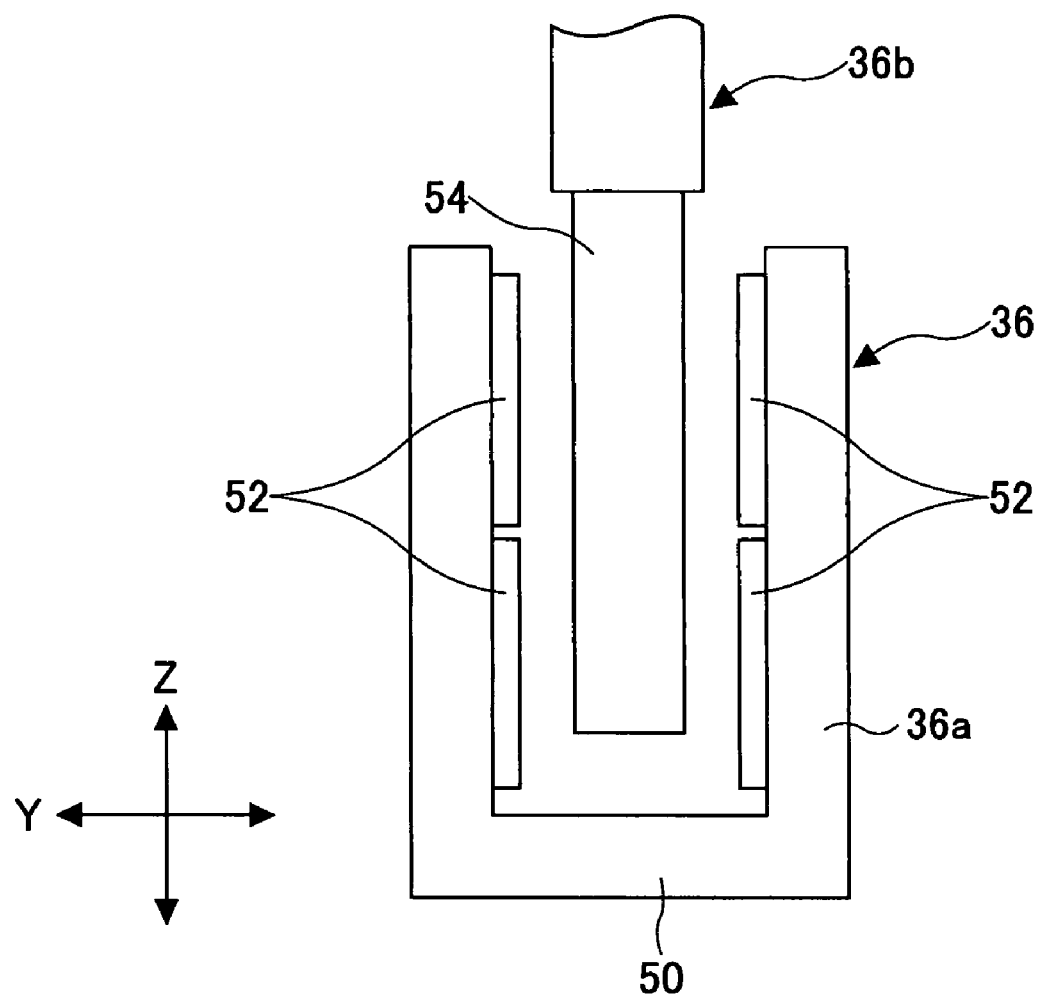
FIG. 3 is a side view of a Z axis actuator 36.
Figure 4:
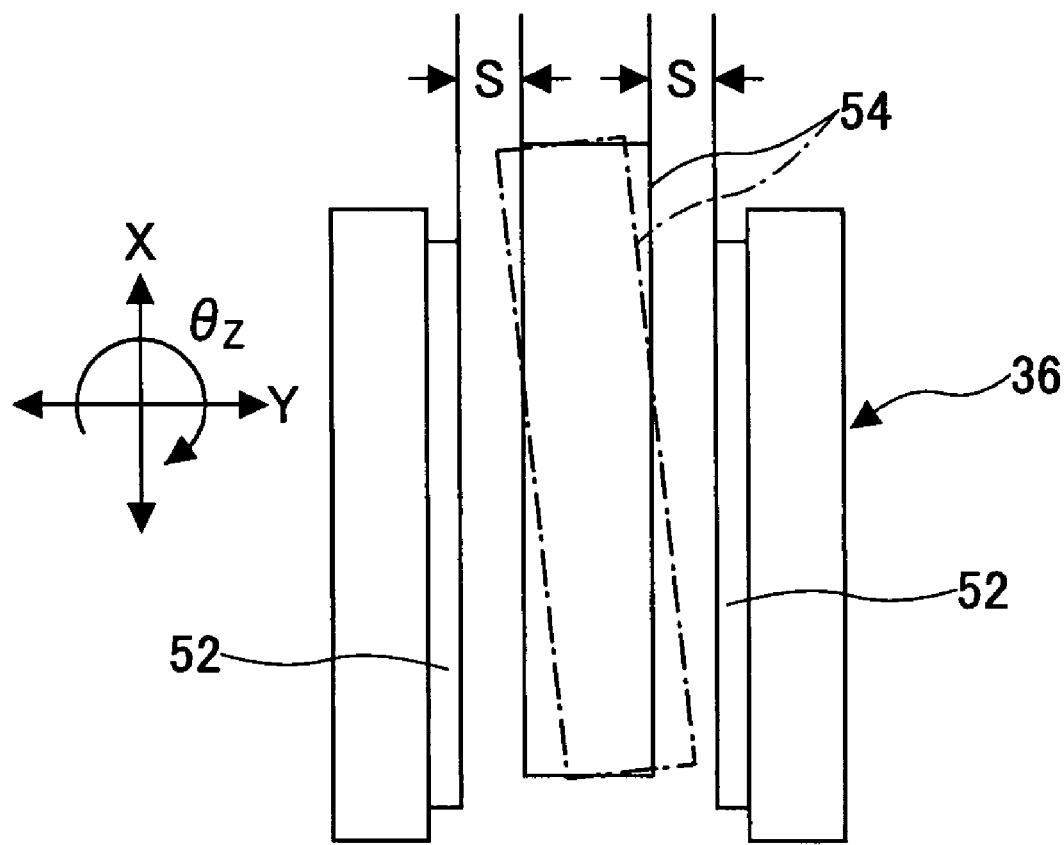
FIG. 4 is a plan view of the Z axis actuator 36.

Here, a structure of the Z axis actuator 36 is discussed with reference to FIG. 3 and FIG. 4. FIG. 3 is a side view of the Z axis actuator 36. FIG. 4 is a plan view of the Z axis actuator 36.

As shown in FIG. 3 and FIG. 4, plate shaped magnets 52 are provided on an internal surface of the magnet yoke 50 of the stator 36*a* of the Z axis actuator 36. The magnet yoke 50 has a U-shaped configuration of rectangle without one side.

A plate shape coil 54 forming the rotor 36*b* is inserted between the magnets 52. In addition, the magnet yoke 50 of the stator 36*a*; of the Z axis actuator 36 has a plan view configuration of a rectangle without one side. The coil 54 can be inserted from an opening side of the Z axis actuator 36. Therefore, in the Z axis actuator 36, the coil 54 can go up and down in the Z axial direction relative to the magnet 52 and be rotated in the θ z direction.

When the wafer holding member 14 and the Z axis supporting base 18 are rotated in the θ z direction, the coil 54 is rotated in the θ z direction against the magnet 52 in the Z axis actuator 36. Therefore, the coil 54 leans as shown by a one dotted line in FIG. 4 if seen from an upper side.

As a gap S between the magnet 52 and the coil 54 is smaller, a greater driving force can be obtained in relation to magnetic flux density. However, in the stage apparatus 10, it is possible to obtain a greater driving force by forming the coil 54 and the magnet 52 of the Z axis actuator 36 in the plate shapes and increasing areas where the magnet 52 and the coil 54 face each other. Therefore, the gap S can be greater than the inclination of the coil 54 caused by the rotation in the θ z direction.

In the example, since the gap S between the magnet 52 and the coil 54 is greater than normal practice, even if the coil 54 is rotated ±2 degrees in the θ z direction, the coil 54 does not come in contact with the magnet 52. Therefore, in the stage apparatus 10, the range of angle adjustment in the θ z direction is expanded.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

Although the structure where the wafer holding member 14 goes up and down is discussed as an example, the present invention is not limited to this. For example, the present invention can be applied to a structure with a holding member where a subject other than the wafer is mounted goes up and down.

In addition, although the structure where the wafer holding member 14 goes up and down by the driving forces of the pair of the Z axis actuators 36 is discussed as an example, the present invention is not limited to this. For example, the present invention can be applied to a structure where two or more Z axis actuators 36 are simultaneously driven so that the wafer holding member 14 goes up and down.

Furthermore, although the structure where the Z axis actuator 36 is formed by the voice coil motor is discussed as an example, the present invention is not limited to this. For example, the present invention can be applied to a case where other type of actuator such as an air pressure cylinder is used.

In addition, although the structure where the θ z supporting base 22 is supported by the XY table 24 is discussed as an example, the present invention is not limited to this. For example, the present invention can be applied to a structure where the θ z supporting base 22 is directly mounted on the Y stage moving the θ z supporting base 22 in only the Y direction.

Thus, according to the above-discussed embodiments of the present invention, it is possible to provide a stage apparatus, including a holding member configured to hold a subject; an elevation supporting member configured to support the holding member so that the holding member can go up and down; a rotation supporting member configured to support the elevation supporting member so that the elevation supporting member can be rotated with respect to a Z axis; and a Z axis driving part configured to elevate the holding member in a Z axial direction; wherein the Z axis driving part is located on the rotation supporting member and makes the holding member go up and down relative to the rotation supporting member.

According to the above-mentioned stage apparatus, since the reaction force caused by driving the holding member by the Z axis driving part is received by the rotation supporting member having a mass greater than that of the elevation supporting member, the vibration may not be generated. The vibration caused by the reaction force of the Z axis driving part is prevented. Even if a large driving force is generated at the time of coarse control in the Z axial direction, the reaction force is not applied to the elevation supporting member. Therefore, the vibration of the elevation supporting member is prevented and settling time after the coarse operation is shortened so that adverse influence on the fine control in the Z axial direction can be reduced.

In the above-mentioned stage apparatus, the rotation supporting member may be mounted on a stage configured to move in a horizontal direction. The Z axis driving part may be provided so that a plurality of parts of the holding member is driven. The Z axis driving part may include a stator fixed to an upper surface of the rotation supporting member; and a rotor connected to the holding member and configured to go up and down relative to the stator. The elevation supporting member may be supported by a bearing located on the rotation supporting member so as to be rotated with respect to the Z axis. The holding member may include a Z axis member, the Z axis member may be engaged with a guide hole forming part having a non-circular shape configuration and formed in the center of a lower surface of the elevation supporting member so as to go up and down.

According to the above-discussed embodiments of the present invention, it is possible to provide a stage apparatus, including a holding member configured to hold a subject; a two-direction guide member configured to support the holding member so that the holding member can go up and down; a rotation supporting member configured to support the elevation supporting member so that the elevation supporting member can be rotated with respect to a Z axis; and wherein a rotation guide member is provided between the two-direction guide member and the rotation supporting member.

What is claimed is:

1. A stage apparatus, comprising:
    a holding member configured to hold a subject;
    an elevation supporting member configured to support the holding member so that the holding member can move up and down;
    a rotation supporting member configured to support the elevation supporting member so that the elevation supporting member can be rotated with respect to a Z axis, said rotation supporting member being in a plate shape and substantially parallel to the holding member;
    a Z axis driving part configured to elevate the holding member in a Z axial direction; and
    a bearing provided to the rotation supporting member;
    wherein the Z axis driving part is directly located on the rotation supporting member and makes the holding member move up and down relative to the rotation supporting member,
    wherein the holding member includes a Z axis member, the Z axis member being engaged with a guide hole forming part having a non-circular shape configuration and formed in the center of a lower surface of the holding member so as to move up and down, and
    wherein the elevation supporting member includes a Z axis guide part and a brim part, the Z axis guide part being engaged to a center portion of the brim part rotatably supported by the bearing so as to rotate together with the brim part.

2. The stage apparatus as claimed in claim 1, wherein the rotation supporting member is mounted on a stage configured to move in a horizontal direction.

3. The stage apparatus as claimed in claim 1, wherein the Z axis driving part is located so that a plurality of parts of the holding member is driven.

4. The stage apparatus as claimed in claim 1, wherein the Z axis driving part includes a stator fixed to an upper surface of the rotation supporting member; and a rotor connected to the holding member and configured to go up and down relative to the stator.

5. The stage apparatus as claimed in claim 1, wherein the elevation supporting member is supported by a bearing located on the rotation supporting member so as to be rotated with respect to the Z axis.

6. The stage apparatus as claimed in claim 1, further comprising:

a driving actuator mounted on the rotation supporting member and configured to rotate the brim part, wherein the rotation supporting member is configured to receive a reaction force in a rotating direction during a rotating operation of the driving actuator.

7. A stage apparatus, comprising:

holding means for holding a subject;

elevation supporting means for supporting the holding means so that the holding means can move up and down;

rotation supporting means for supporting the elevation supporting means so that the elevation supporting means can be rotated with respect to a Z axis;

a bearing provided to the rotation supporting means; and means for elevating the holding member in a Z axial direction;

wherein the means for elevating the holding member in the Z axial direction is directly located on the rotation supporting means and makes the holding means move up and down relative to the rotation supporting means, wherein the holding means includes a Z axis member, the Z axis member being engaged with a guide hole forming part having a non-circular shape configuration and formed in the center of a lower surface of the holding means so as to move up and down, and wherein the elevation supporting means includes a Z axis guide part and a brim part, the Z axis guide part being engaged to a center portion of the brim part rotatably supported by the bearing so as to rotate together with the brim part.

8. The stage apparatus as claimed in claim 7, wherein the rotation supporting member is mounted on a stage configured to move in a horizontal direction.

9. The stage apparatus as claimed in claim 7, wherein the means for elevating the holding member in the Z axial direction is located so that a plurality of parts of the holding member is driven.

10. The stage apparatus as claimed in claim 7, wherein the means for elevating the holding member in the Z axial direction includes a stator fixed to an upper surface of the rotation supporting member; and a rotor connected to the holding member and configured to go up and down relative to the stator.

11. The stage apparatus as claimed in claim 7, wherein the elevation supporting member is supported by a bearing located on the rotation supporting member so as to be rotated with respect to the Z axis.

12. A stage apparatus, comprising:

a holding member configured to hold a subject;

a two-direction guide member configured to support the holding member so that the holding member can go up and down;

a rotation supporting member configured to support the two-direction guide member so that the two-direction guide member can be rotated with respect to a Z axis, said rotation supporting member being in a plate shape and substantially parallel to the holding member, wherein a rotation guide member is provided between the two-direction guide member and the rotation supporting member, and wherein the holding member includes a Z axis member, the Z axis member being engaged with a guide hole forming part having a non-circular shape configuration and formed in the center of a lower surface of the elevation supporting member so as to go up and down.

* * * * *